United States Patent
Donolo et al.

(10) Patent No.: US 10,732,223 B2
(45) Date of Patent: Aug. 4, 2020

(54) CIRCUIT BREAKER HEALTH MONITORING

(71) Applicant: Schweitzer Engineering Laboratories, Inc., Pullman, WA (US)

(72) Inventors: Marcos A. Donolo, Pullman, WA (US); Scott M. Manson, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/053,601

(22) Filed: Aug. 2, 2018

(65) Prior Publication Data

US 2019/0079134 A1   Mar. 14, 2019

Related U.S. Application Data

(60) Provisional application No. 62/558,690, filed on Sep. 14, 2017.

(51) Int. Cl.
  *G01R 31/327*  (2006.01)
  *H01H 71/04*  (2006.01)

(52) U.S. Cl.
  CPC ..... *G01R 31/3277* (2013.01); *G01R 31/3278* (2013.01); *H01H 71/04* (2013.01); *H01H 2071/044* (2013.01)

(58) Field of Classification Search
  None
  See application file for complete search history.

(56) References Cited

U.S. PATENT DOCUMENTS

| | | | | |
|---|---|---|---|---|
| 3,633,071 A | * | 1/1972 | Fendt | H02H 3/283 361/63 |
| 4,616,198 A | * | 10/1986 | Pardini | H01H 71/04 335/16 |
| 4,685,024 A | * | 8/1987 | Martellock | H02H 3/0935 361/86 |
| 5,015,977 A | * | 5/1991 | McKay | H01H 71/04 335/17 |
| 5,049,846 A | * | 9/1991 | Morgan | H01H 9/0072 200/329 |
| 5,075,659 A | * | 12/1991 | Morgan | H01H 9/0072 200/308 |
| 5,084,689 A | * | 1/1992 | Morgan | H01H 9/0072 335/202 |
| 5,089,795 A | * | 2/1992 | Morgan | H01H 9/0072 335/193 |
| 5,157,575 A | | 10/1992 | Feltis | |
| 6,529,112 B1 | * | 3/2003 | Leone | H01R 4/36 337/113 |
| 6,825,431 B2 | | 11/2004 | Azzola | |

(Continued)

*Primary Examiner* — Fekadeselassie Girma
(74) *Attorney, Agent, or Firm* — Bradley W. Schield; Richard M. Edge (57) ABSTRACT

Monitoring a health status of a current interruption device, such as a circuit breaker, is disclosed herein. For example, a device for monitoring a current interruption device may include a processor and a memory. The processor may execute instructions stored in the memory to cause the processor to monitor one or more current measurements of current from an electrical conductor that delivers electrical energy to a load. The processor may provide a signal indicating a health status of the current interruption device based at least in part on the one or more current measurements.

20 Claims, 5 Drawing Sheets

(56) References Cited

U.S. PATENT DOCUMENTS

| | | | | |
|---|---|---|---|---|
| 7,148,774 | B1* | 12/2006 | Shea | H01H 1/22 335/16 |
| 7,186,941 | B2 | 3/2007 | Yeon | |
| 8,014,115 | B2* | 9/2011 | Vicente | H02H 7/30 361/93.1 |
| 8,649,146 | B2* | 2/2014 | Williams | H02H 1/06 361/115 |
| 9,406,466 | B2 | 8/2016 | Yang | |
| 10,483,068 | B1* | 11/2019 | Sinha | H01H 73/20 |
| 2002/0144978 | A1* | 10/2002 | Leone | H01H 9/342 218/154 |
| 2004/0251994 | A1* | 12/2004 | Tobin | H01H 1/2058 335/172 |
| 2005/0275493 | A1* | 12/2005 | Yamazaki | H01H 9/30 335/202 |
| 2006/0025944 | A1* | 2/2006 | Payack, Jr. | G01R 23/20 702/66 |
| 2006/0120000 | A1* | 6/2006 | Fiesoli | H02H 3/025 361/93.1 |
| 2006/0254893 | A1* | 11/2006 | Mills | H01H 71/04 200/313 |
| 2007/0095794 | A1* | 5/2007 | Zindler | H01H 9/46 218/151 |
| 2007/0252599 | A1* | 11/2007 | Zhou | H01H 9/563 324/424 |
| 2007/0253124 | A1* | 11/2007 | Zhou | H01H 9/563 361/2 |
| 2008/0012666 | A1* | 1/2008 | Davison | H02H 1/046 335/18 |
| 2008/0079519 | A1* | 4/2008 | Shea | H01H 77/108 335/201 |
| 2008/0100140 | A1* | 5/2008 | Sorenson | H02J 13/0062 307/40 |
| 2008/0129112 | A1* | 6/2008 | Mills | B64D 11/0015 307/9.1 |
| 2008/0246566 | A1* | 10/2008 | Oh | H01H 71/08 335/197 |
| 2010/0164658 | A1* | 7/2010 | Woo | H01H 71/2463 335/21 |
| 2010/0236909 | A1* | 9/2010 | Biedrzycki | G02B 6/0001 200/310 |
| 2011/0013345 | A1* | 1/2011 | Singh | H01H 9/0072 361/673 |
| 2011/0048911 | A1* | 3/2011 | Song | H01H 1/5833 200/337 |
| 2011/0198928 | A1* | 8/2011 | Lee | H02J 9/08 307/39 |
| 2011/0249370 | A1* | 10/2011 | Nayak | H02H 1/0015 361/42 |
| 2012/0123762 | A1* | 5/2012 | Studer, II | H02H 7/226 703/14 |
| 2012/0154957 | A1* | 6/2012 | Williams | H02H 1/06 361/1 |
| 2012/0187089 | A1* | 7/2012 | Chen | H01H 33/14 218/2 |
| 2012/0212348 | A1* | 8/2012 | Subramanian | H02H 7/30 340/638 |
| 2013/0056340 | A1* | 3/2013 | Serpinet | H01H 1/2083 200/502 |
| 2013/0135066 | A1* | 5/2013 | Korber | H01H 3/3052 335/73 |
| 2014/0339198 | A1* | 11/2014 | Baek | H01H 71/10 218/154 |
| 2015/0092464 | A1* | 4/2015 | Uehira | H02M 7/53871 363/95 |
| 2015/0276877 | A1* | 10/2015 | Biswas | G01R 31/3275 702/58 |
| 2017/0047184 | A1* | 2/2017 | Ashtekar | H01H 71/04 |
| 2017/0098520 | A1* | 4/2017 | Mittelstadt | H01H 71/04 |
| 2017/0163023 | A1* | 6/2017 | Niehoff | H02H 7/30 |
| 2017/0202068 | A1* | 7/2017 | Dickey | H05B 45/37 |
| 2018/0294643 | A1* | 10/2018 | Donath | H02H 7/226 |

* cited by examiner

CIRCUIT BREAKER HEALTH MONITORING

RELATED APPLICATION

The present application claims the benefit under 35 U.S.C. § 119(e) of U.S. Provisional Patent Application No. 62/558,690, entitled "Circuit Breaker Health Monitoring", filed Sep. 14, 2017, which is herein incorporated by reference in its entirety and for all purposes.

TECHNICAL FIELD

This disclosure relates to health monitoring. More particularly, this disclosure relates to monitoring the current interrupted by a current interruption device, such as a circuit breaker, to determine whether the current interruption device should be replaced.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems are implemented to generate, transform, transmit, and distribute electric power to loads. Many loads that consume electric power are in the form of motors, which transform electrical power into mechanical power to do work. To ensure that motors are available, installations of electric motors often include IEDs to monitor the electric power delivered to the motors, switches to connect and disconnect electric power to the motors, and circuit breakers for rapid disconnection of electric power from the motors. In many cases, the circuit breakers are in the form of MCCBs, which include mechanical features for extinguishing an arc that may form between contacts in the MCCBs when a current is interrupted by the MCCB. Such mechanical features may be damaged by extinguishing an arc, reducing the ability of the mechanical features to extinguish future arcs. If, however, an arc of lower energy is extinguished, less or no damage may occur to the mechanical features. Unfortunately, the status of the mechanical features is not readily observable. Accordingly, in many instances MCCBs will be replaced each time it is operated, regardless of the status of the mechanical features. What is needed is a system and method to monitor health of MCCBs such that they are replaced when warranted.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

Three-phase motors are widely used throughout industry to transform electrical energy to mechanical energy which may be used to perform work. Motors are often necessary pieces of equipment for performing numerous industrial tasks from pumping water to processing materials. Motors are often an integral part of industrial processes. Loss of use of a motor can cause great delays and loss of income while the motor is off line. Note that, while some embodiments described herein include motors, any suitable electrical load in the power system may be used, such as cables, transformers, inverters, power supplies, variable speed drives, etc.

Monitoring and protection loads may be controlled such that a load may not be taken off line unless it is indeed experiencing a condition that would warrant such action, yet may be promptly removed from service when operation outside of predetermined conditions is detected. For example, motor protection schemes meant to interrupt a motor startup due to overheating attempt to determine as accurately as possible the temperature conditions of the rotor. If the schemes are overly conservative, the motor startup would be prematurely stopped, resulting in unnecessary and disruptive downtime. However, if the schemes underestimate the actual temperature conditions, the motor may experience unnecessary overheating due to the elevated temperature conditions.

Intelligent electronic devices (IEDs) are often used to monitor various aspects of loads, such as electric motors, and provide protection thereto. For example, using certain values provided by the motor manufacturer as well as the currents and voltages supplied to the motor, IEDs can be programmed to determine various conditions of the motor and provide protection to the motor by taking the motor off line when certain conditions are determined to be present in the system. For instance, the IED may be programmed to determine the temperature of the rotor and take the motor off line if the temperature exceeds a certain value.

Figure 1:
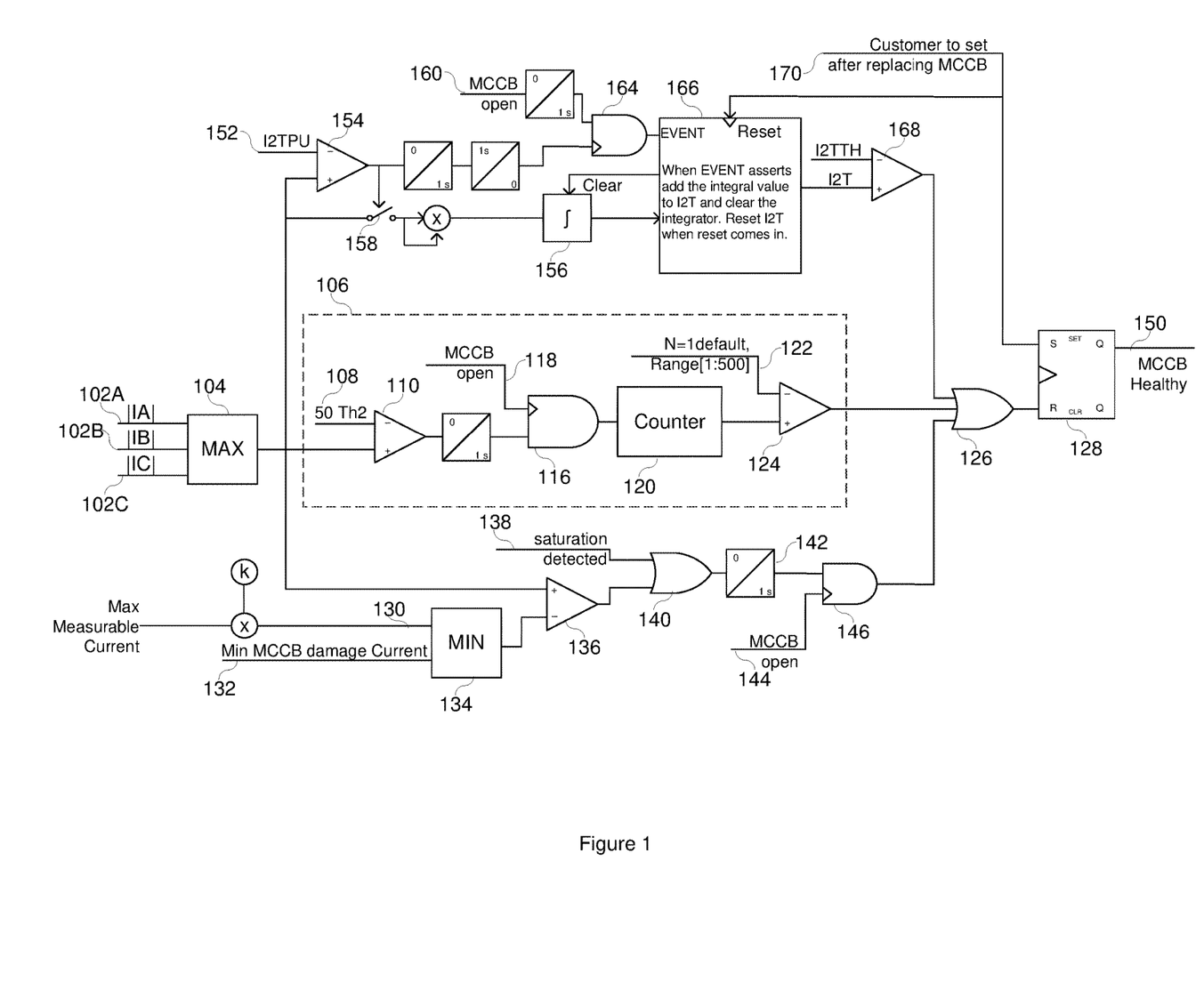
FIG. 1 illustrates a simplified logic diagram of a method for monitoring health of a molded case circuit breaker (MCCB) according to several embodiments herein.

IEDs may be configured to connect an electric power source to a motor using a switch. Switches are typically designed to connect or disconnect under certain operating conditions that would not result in arcing between the contacts thereof. For example, switches are typically designed to open when current is below a predetermined threshold. If the conditions indicate that the motor must be rapidly disconnected from the electric power source, the IED may be configured to operate a circuit breaker, such as an MCCB, designed to quickly disconnect the motor even when the current exceeds the operating threshold of the switch, and to extinguish an arc that may form between the contacts of the circuit breaker. Further, the IED may monitor a health status of the current interruption device, such as the circuit breaker. Note that, while a circuit breaker is used as an example in embodiments described below, the IED may monitor the health status of any suitable current interruption device, FIG. 1 illustrates logic of a method that may be operated by an IED to monitor the health of a current interruption device, such as an MCCB. The IED obtains current measurements, and determines the magnitudes of the incoming current values 102A, 102B, and 102C. It should be noted that the illustrated logic assumes a three-phase motor and a three-phase MCCB. Although a three-phase system is illustrated, the logic is applicable to systems with more or fewer phases, or DC. For example, the system may be used on a single-phase system with a single-phase motor and a single-phase MCCB.

A maximum current of the measured currents is determined 104. The maximum current 104 is used by the overcurrent counter 106 to determine a health of the MCCB. An operation is counted by counter 120 when a signal is received from AND gate 116 indicating that both: 1) the maximum current 104 exceeds, at comparator 110, an overcurrent threshold 108 during the period of time in which the MCCB transitions to open; and, 2) the MCCB transitions to open 118, for example, upon receiving a signal from the IED or upon detecting an overcurrent. When the counter 120 exceeds a predetermined number of permitted operations 122 (the number of permitted operations 122 may be a setting related to a number of operations that the MCCB may be expected to withstand before the MCCB must be replaced) at comparator 124, then a "MCCB Healthy" flag 150 is removed. That is, the "MCCB Healthy" 150 indication persists until the overcurrent counter 106 indicates that the MCCB has operated to interrupt current that exceeds a predetermined threshold 122 a predetermined number of times.

In certain embodiments, other operations may be used to remove the "MCCB Healthy" flag 150. In one embodiment, the maximum measurable current may be multiplied by a factor k, which may be a value between 1 and 0.9. The IED may determine a minimum 134 between the maximum measurable current multiplied by the factor k and the minimum MCCB damage current 132. The minimum 134 may be compared, at comparator 136, to the maximum current 104. At OR operand 140, if the maximum current 104 exceeds the minimum 134 or saturation is detected 138, the MCCB healthy flag 150 may be removed if MCCB is opened 144 during that period of time 142 in which the current is exceeded (e.g., the maximum current 104 exceeds the minimum 134 or saturation is detected 138). That is, when CT saturation is detected, then it is difficult to determine the actual current that was interrupted by the MCCB, and it should be assumed that the MCCB is damaged during operation. Accordingly, the "MCCB Healthy" flag 150 is removed.

Additionally, if the maximum measured current exceeds the lesser of the minimum current needed to damage the MCCB or the maximum measurable current, then it is difficult to determine the actual current that was interrupted by the MCCB, and it should be assumed that the MCCB is damaged during operation. Accordingly, the "MCCB Healthy" flag 150 is removed.

In another embodiment, the "MCCB Healthy" flag 150 is removed depending on a calculation of the amount of current interrupted over time. Accordingly, when the maximum measured current 104 exceeds 154 a predetermined current $I^2T$ value 152, the maximum current is directed 158 to integrator 156, where it is accumulated until an event signal occurs 166. An EVENT signal from the AND gate 164 is provided when both 1) occurrence of an MCCB open signal 160; and, 2) a change in state from comparator 154 indicating that the maximum current 104 exceeds the predetermined $I^2T$ value 152. Various timers may be used to hold the change in state signal for a predetermined time such that an appropriate amount of current is accumulated. That is, upon exceeding of the $I^2T$ threshold 154, the maximum current values 104 are accumulated using, for example, an integrator 156, until the MCCB opens. The integrator may receive the maximum current 104 upon activation of switch 158 by the comparator 154 indicating that the maximum current 104 exceeds the $I^2T$ threshold 152. The values continue to be accumulated through subsequent operations 166 until the value exceeds a lifetime MCCB $I^2T$ threshold value 168. Upon exceeding the lifetime MCCB $I^2t$ value 168, the "MCCB Healthy" flag 150 is removed. When the MCCB is replaced, the monitoring system may also be reset 170, which resets the flag and the accumulated $I^2T$ values.

The MCCB healthy flag 150 may be removed by analyzing current compared to a variety of predetermined thresholds. For example, the IED may control communication circuitry that indicates the MCCB healthy flag 150, from the OR operation 126, based on the overcurrent counter 106 exceeding the predetermined number of permitted operations 122, based on current exceeding a predetermined current threshold associated with a maximum measurable current and/or a minimum MCCB damage current 132 or saturation being detected, based on accumulated amount of current over time exceeding a lifetime amount of current over time threshold, or any combination thereof. The MCCB health monitoring system may be used in various IEDs to monitor health status of a circuit breaker. An example of IEDs that may be used to perform such monitoring are described in detail below.

Figure 2:
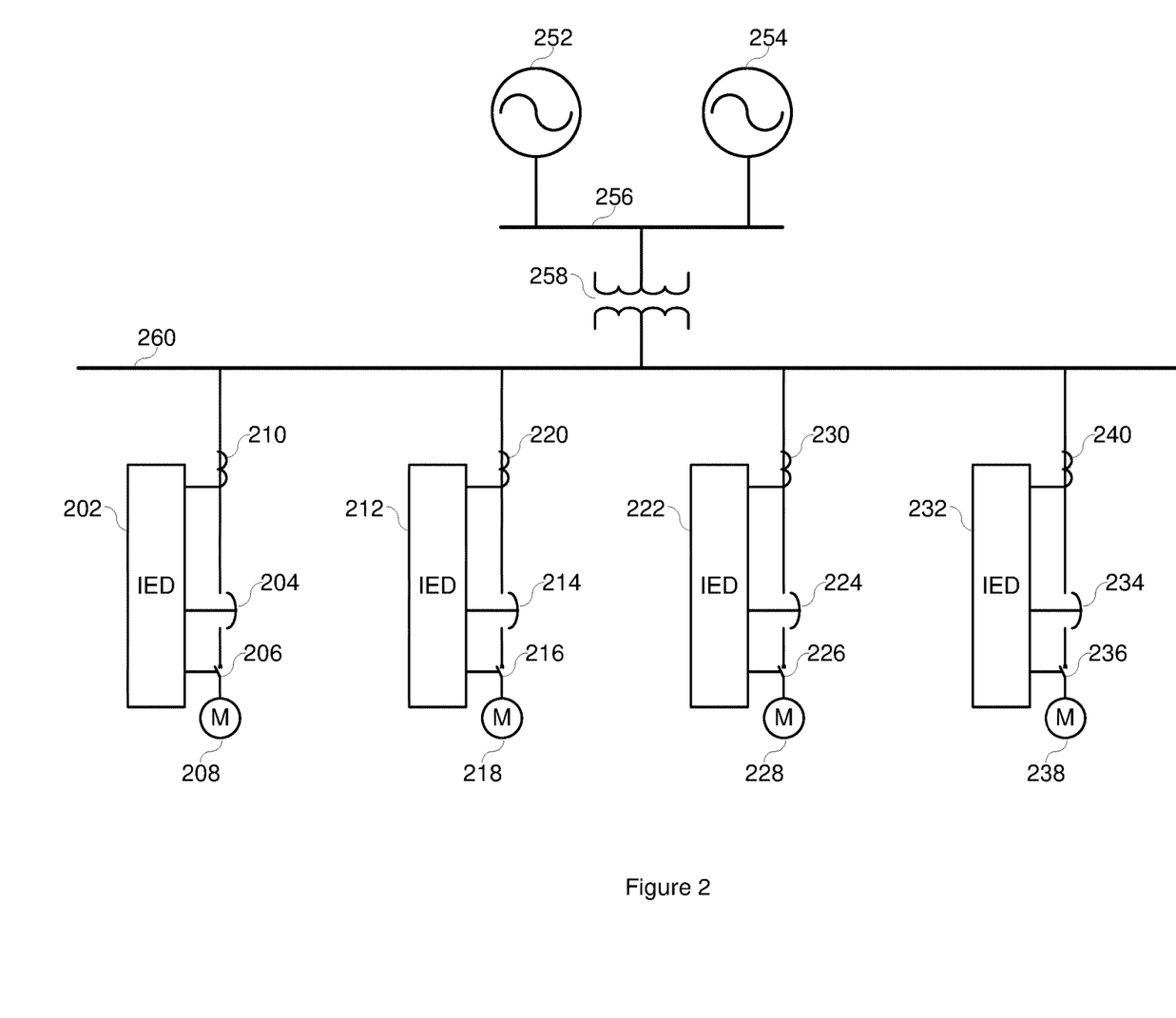
FIG. 2 illustrates a simplified one-line diagram of an electric power delivery system in accordance with several embodiments herein.

FIG. 2 illustrates a simplified one line diagram of an electric power delivery system for delivering electric power to various motors. The system may be a three-phase electric power delivery system. The system may include portions that are single phase or direct current. The system may include equipment that is not separately illustrated in FIG. 2 such as, for example, switches, buses, circuit breakers, transmission equipment, distribution equipment, transformers, capacitor banks, reactors, voltage regulators, and so forth. The illustrated system includes generators 252 and 254 supplying electric power to bus 260 via generator bus 256 and transformer 258. It should be noted that various different systems may be used for the generation, transform, transmission, and distribution of electric power may be used. Motors 208, 218, 228, and 238 receive electric power from bus 260. Switches 206, 216, 226, and 236 may be used to connect and disconnect respective motors from bus 260 in controlled situations only. For example, a switch may be used to connect a motor to the electric power source. The switch may be used to disconnect the motor when the current therethrough is less than a predetermined threshold.

Motors 208, 218, 228, and 238 may be monitored and protected using IEDs 202, 212, 222, and 232, respectively. IEDs 202, 212, 222, and 232 may obtain measurements of the electric power to the motors using, for example, current transformers (CTs) 210, 220, 230, and 240, potential transformers (PTs, not separately illustrated), or the like. IEDs may be configured to operate switches 206, 216, 226, and 236.

To interrupt current to motors 208, 218, 228, and 238 either on a rapid basis or when the current exceeds a threshold, IEDs 202, 212, 222, and 232 may be configured to operate MCCBs 204, 214, 224, and 234. MCCBs 204, 214, 224, and 234 may be in normally-closed configuration, and open when an trip signal is received from the respective IED. Accordingly, IEDs may be configured to monitor and protect motors using switches and circuit breakers.

Figure 3:
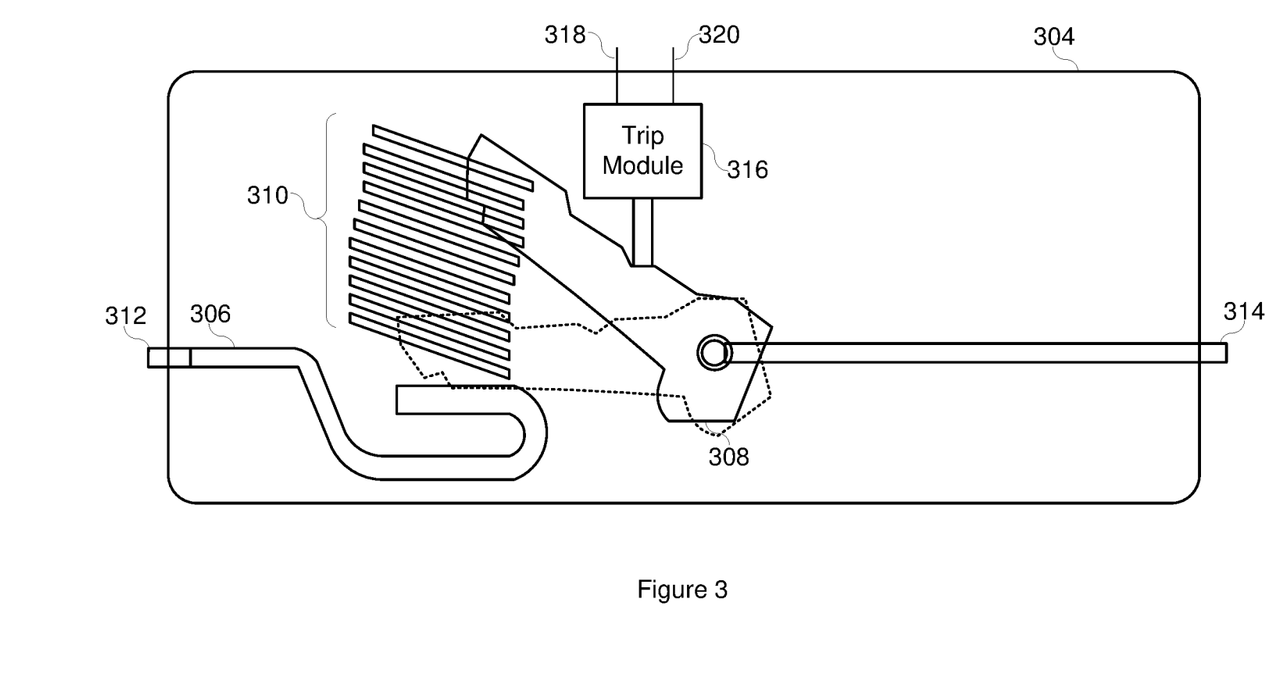
FIG. 3 illustrates a simplified block diagram of certain parts of the MCCB.

FIG. 3 illustrates a cut-away simplified block diagram of a single-phase portion of an MCCB 304. The MCCB 304 includes contacts 306 and 308, in electrical communication with terminals 312 and 314. Contact 308 is moveable between an open position (illustrated in solid line) and in closed position (illustrated in dotted line). MCCB 304 may include several additional mechanisms useful for opening and closing contactor 308 that are not illustrated herein.

MCCB 304 also includes mechanical features 310 configured to extinguish an arc when contactor 308 opens when current is flowing to the motor. The mechanical features 310 may be in the form of an arc extinguisher assembly, installed to at least partially surround fixed and moveable contactors 306, 308. The mechanical features 310 may include a plurality of plates made of materials configured to extinguish arcs. In certain embodiments, the plates may be made of insulating materials such as plastic, glass, fiberglass, or the like.

When the MCCB 304 is operated to rotate the moveable contactor 308 from a closed position to an open position while current is flowing through the contactors, an arc occurs between the fixed contact 306 and moveable contact 308. The arc is extended and cooled by the plates of the arc extinguisher assembly 310 to extinguish the arc. When the interrupted current is sufficiently high, the plates may be damaged while extending and cooling the arc. However, interrupting an arc when the current is below a threshold, little or no damage occurs to the plates making up the mechanical features 310. In general, damage to the plates may increase, albeit non-linearly, with the interrupted current.

MCCB 304 may further include an internal trip module 316 configured to sense the electrical current passing through the MCCB via contactors 306 and 314. The internal trip module 316 may operate on any of a variety of electrical, mechanical, thermal, hydraulic, or processor-based platforms, or a combination of such platforms. For example, the trip module 316 may operate on a thermal platform whereby a bimetallic element with unequal thermal expansion causes the element to bend, resulting in an inverse time characteristic for tripping the contactors to open. In another example, the trip module 316 may operate on a mechanical or magnetic platform whereby an electromagnet is connected in series with the current flowing through the MCCB, and designed to trip when the current exceeds a predetermined threshold with no intentional delay. In some embodiments, both a thermal and a mechanical tripping mechanisms are used to trip the MCCB open. In still other embodiments, a processor-based tripping module 316 may be used to detect the current through the MCCB and cause the MCCB to trip open.

In various embodiments, MCCBs may be controlled by an external IED, whereby the trip module 316 of the MCCB 304 may include an input 318 used by the IED to signal the MCCB 304 to trip open the contact. In certain embodiments, the input 318 may be in direct electrical communication with an electromagnet and insert a current of sufficient magnitude to cause the electromagnet to trip open the contacts. Various other mechanisms may be used to trip the MCCB on command.

In certain embodiments, the MCCB may include an output 320 to signal when the MCCB 304 has operated to open the contacts. The output 320 may be in the form of a contact output that changes state upon operation of the MCCB 304. Accordingly, an IED in communication with the MCCB 304 may be notified using the contact output 320 that the MCCB 304 has operated to trip off the connected motor. In some embodiments, the IED may issue an internal trip command indicating that current was interrupted. That is, any suitable way to notify the IED that the circuit breaker was tripped may be used. In certain embodiments, the IED may issue a trip command and provide the signal indicating the health status of the circuit breaker upon issuing the trip command of the circuit breaker based on the characteristics described with respect to FIG. 1.

As indicated above, due to the possibility of damage to the mechanical features 310, MCCBs are often replaced each time they are operated, even if no or little damage to the mechanical features 310 has occurred. Accordingly, operational and safe MCCBs are prematurely replaced.

As explained with respect to FIG. 1, systems and methods to monitor MCCBs and indicate a health status of the MCCBs such that they may be replaced when the mechanical arc extinguisher features are likely damaged, and leave MCCBs in place when the mechanical arc extinguisher features are likely still operable to extinguish an arc when operated.

Figure 4:
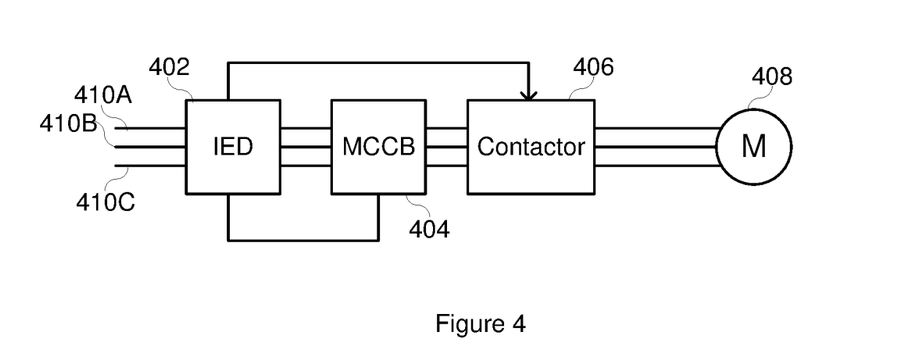
FIG. 4 illustrates a simplified diagram of an intelligent electronic device (IED) monitoring electric power to a load that may perform the logic described with respect to FIG. 1.

FIG. 4 illustrates a simplified block diagram useful to monitor and protect an electric motor, and monitor a health status of an MCCB operable to interrupt current to the motor. Three phases of electric power are delivered to the motor 408 using conductors 410A, 410B, and 410C. IED 402 obtains current measurements from the conductors 410A, 410B, and 410C representative of current delivered to the motor 408. The IED 402 may perform many monitoring and protection functions for the motor 408, and operate either an MCCB 404 or a contactor 406 (which may be a switch) depending on the outcome of the monitoring and protection functions. The IED may also receive information from the MCCB 404 such as, for example a change of state of the MCCB 404 via a contact output indicating that the MCCB 404 has operated to trip off current to the motor 408 by electrically decoupling (e.g., opening) the moveable contact 208. For example, the IED 402 may monitor the motor 408 for thermal conditions, phase balance, undercurrent, underpower, or the like, and operate the contactor 406 if such conditions warrant. Contactor 406 may be configured to interrupt current below a threshold level. In addition, IED 402 may be configured to monitor the motor 408 for an overcurrent condition, and operate the MCCB 404 if an overcurrent condition is detected. Because the IED 402 monitors and detects current flowing to the motor 408, the IED can track and make decisions based on the current levels at the instant of operation of the contactor 406 and MCCB 404. According to several embodiments herein, the IED determines the current magnitude when the MCCB 404 is operated, and determines a health condition of the MCCB 404 depending on the current magnitude when the MCCB 404 is operated.

Figure 5:
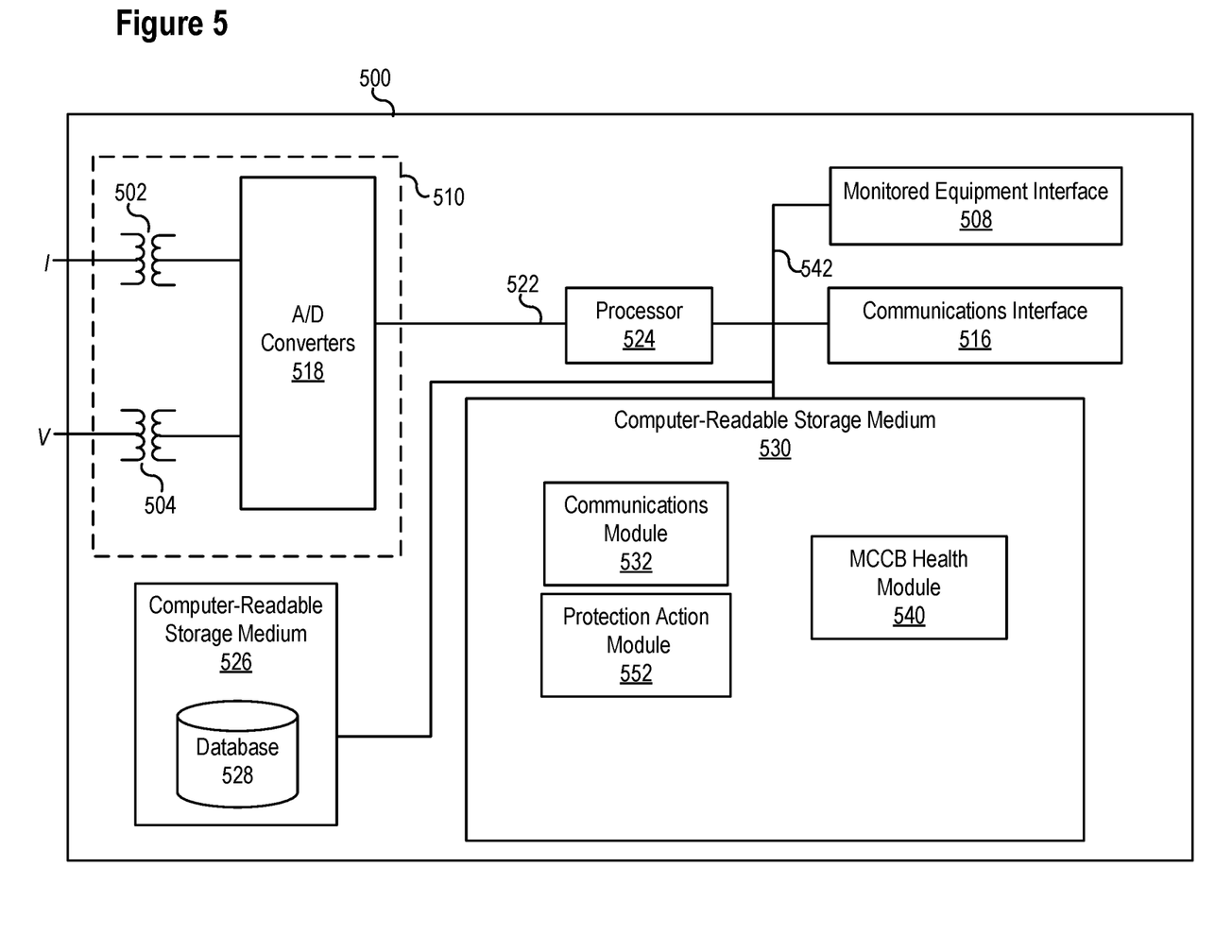
FIG. 5 illustrates a functional block diagram of an IED useful for monitoring health of an MCCB according to several embodiments herein.

FIG. 5 illustrates a simplified block diagram of an IED 500 that may be used to monitor a motor and monitor a health of an MCCB that may be used to interrupt current to a motor above a predetermined threshold. The IED may include a sensor circuitry 510 configured to receive electric current and/or voltage signals, transform the signals using transformers 502, 504 to a level that may be sampled, and sample the signals using, for example, A/D converter(s) 518 to produce digitized analog signals 522 representative of measured current and/or voltage to the electric motor.

IED 500 may include a processor 524 in communication with the sensor circuitry 510 to receive the digitized analog signals, and perform monitoring and protection of an electric motor using the digitized analog signals.

IED 500 may include a monitored equipment interface 508 in communication with the processor 524 via bus 542, and further in communication with monitored equipment such as MCCBs, switches, contactors, and the like. As described herein, IED may send open, close, and trip signals to MCCBs and switches using the monitored equipment interface 508. Further, the IED 500 may receive status information from the MCCB via the monitored equipment interface 508, such as when the MCCB opens.

IED 500 may include a communications interface 516 to facilitate communications with other IEDs, higher-level systems such as Supervisory Control and Data Acquisition (SCADA) systems, automation systems, and the like. For example, the communications interface 516 may include communications circuitry (e.g., a transceiver) to send and/or receive communication signals.

IED 500 may include a computer-readable storage medium 526 which may be the repository of a database 528. Various measurements, information, and other data may be stored on the database 528.

IED 500 may include a computer-readable storage medium 530 storing instructions that, when operated on the processor 524 cause the processor to perform various functions as described herein. The computer-readable storage medium 530 may include various modules such as a communications module 532, protection action module 552, MCCB health module 540, and the like.

Communications module 532 may be configured to facilitate communications with other devices and monitored equipment using, for example, the monitored equipment interface 508, communications interface 516, and the like.

Protection action module 552 may be configured to monitor the motor for various conditions such as, for example, thermal conditions, overcurrent conditions, phase unbalance, and the like, and when an abnormal condition is detected, to send trip or open signals to the MCCB and/or contactor using the monitored equipment interface, according to the various embodiments herein.

The MCCB health module 540 may be configured to monitor the health of the MCCB according to the various embodiments herein. The MCCB health module 540 may use the digitized analog current signals from sensor circuitry 510. The MCCB health module 540 may be used to communicate the MCCB healthy flag to an operator using an integrated human-machine interface (HMI), LCD screen, LED indicator, or the like. The MCCB health module 540 may indicate the MCCB healthy flag to an operator or supervisory system using the communications interface 516. For example, the processor 524 may execute instructions stored in the MCCB health module 540 to determine the health status of the MCCB. The processor 524 may send, via the communications circuitry (e.g., the transceiver, one or more LEDs, one or more mechanical indicators, one or more registers of the MCCB, one or more output pins of the MCCB, etc.) of the communications interface 516, an output signal indicating the health status of the circuit breaker. The processor 524 may send the output signal indicating the health status to control operation of an indicator, such as a display, an LED indicator, an HMI interface, or a mechanical indicator, to indicate the health status of the circuit breaker to an operator. In another embodiment, the processor 524 may transmit, via a transceiver of the communication circuitry, the output signal to another electronic device. For instance, the processor 524 may send the output signal to effect a control operation (e.g., disconnect the motor) on the power system based on the health status using the switch 206, 216, 226, and 236 discussed with respect to FIG. 2. In some embodiments, the processor 524 may control the contactor comprising preventing a contactor from closing until the circuit breaker is replaced.

Systems and methods described herein may improve IED technology in power systems. By determining a health status of circuit breakers, the IED may enable power systems to have fewer circuit breakers replaced. For example, the IED may send a signal to control an indicator to maintain a MCCB healthy flag to allow the circuit breaker to continue operation in cases where it would otherwise be replaced, thereby reducing overhead in maintaining the power system. In some embodiments, the systems and methods described herein may enable additional functionality to IED technology by determining a health status of a circuit breaker. For example, the health status determination may enable control operations, outputting indications, and the like, to reduce replacing operational circuit breakers.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A monitoring device, comprising:
a memory; and
a processor communicatively coupled to the memory, wherein the processor is configured to execute instructions stored in the memory to cause the processor to:
obtain an amount of current on an electrical conductor that delivers electrical energy to a load;
obtain a signal indicating tripping of a circuit breaker, wherein the circuit breaker is electrically connected to the electrical conductor to control current flow on the electrical conductor;
determine a health status indicating whether a mechanical arc extinguishing feature of the circuit breaker is damaged for subsequent operation based at least in part on the amount of current interrupted by the circuit breaker during tripping of the circuit breaker; and
provide a signal indicating the health status of the circuit breaker.

2. The monitoring device of claim 1, wherein the processor is configured to execute instructions stored in the memory to cause the processor to determine a maximum current of a three-phase power delivery system in determining the health status.

3. The monitoring device of claim 1, wherein the processor is configured to execute instructions stored in the memory to cause the processor to determine that the circuit breaker is not healthy based at least in part on a comparison between the the amount of current and either a maximum measurable current multiplied by a factor or a minimum circuit breaker damage current.

4. The monitoring device of claim 1, comprising a current transformer, wherein the processor is configured to execute instructions stored in the memory to cause the processor to provide the signal indicating that circuit breaker is not healthy upon detecting saturation of the current transformer by the current being delivered to the load.

5. The monitoring device of claim 1, wherein the processor is configured to execute instructions stored in the memory to cause the processor to:
count a number of operations that the the amount of current exceeds a current threshold during the period of time in which the circuit breaker transitions to open; and
provide the signal indicating that the circuit breaker is not healthy when the number of operations exceeds a predetermined number of permitted operations.

6. The monitoring device of claim 1, wherein the processor is configured to execute instructions stored in the memory to cause the processor to:
compare the amount of current to a predetermined value;
upon exceeding the predetermined value, determine an $I^2t$ value by squaring the the amount of current and integrating the squared current over a time period from when the predetermined value is exceeded to opening of the circuit breaker;
adding the $I^2t$ value to a sum of $I^2t$ values;
compare the sum of $I^2t$ values to a lifetime $I^2t$ threshold; and
upon exceeding the lifetime $I^2t$ threshold, provide the signal indicating that the circuit breaker is not healthy.

7. The monitoring device of claim 6, wherein the processor is configured to execute instructions stored in the memory to cause the processor to reset the sum of $I^2t$ values upon replacing the circuit breaker with another circuit breaker.

8. The monitoring device of claim 1, wherein the processor is configured to execute instructions stored in the memory to cause the processor to:
issue a trip command to trip the circuit breaker upon an occurrence of a predetermined condition; and
upon issuing the trip command, provide the signal indicating the health status of the circuit breaker.

9. A non-transitory, computer readable medium comprising instructions configured to be executed by a processor to communicate circuit breaker health, wherein the instructions are configured to cause the processor to:
obtain an amount of current through a an electrical conductor that delivers energy to a load;
obtain a signal indicating tripping of a circuit breaker, wherein the circuit breaker is electrically connected to the electrical conductor to control current flow on the electrical conductor;
determine a health status indicating whether a mechanical arc extinguishing feature of the circuit breaker is damaged for subsequent operation based at least in part on the amount of current interrupted by the circuit breaker during tripping of the circuit breaker; and
send a signal indicating the health status of the circuit breaker.

10. The non-transitory, computer-readable medium of claim 9, wherein the instructions are configured to cause the processor to determine the health status based on a comparison of a predetermined threshold to a number of operations in which a current threshold is exceeded by the the amount of current.

11. The non-transitory, computer-readable medium of claim 10, wherein the predetermined threshold is associated with a total number of operations that the circuit breaker is expected to withstand before being replaced.

12. The non-transitory, computer-readable medium of claim 9, wherein the instructions are configured to cause the processor to determine the health status based on a comparison between the amount of current and a predetermined threshold associated with a maximum measurable current, a minimum circuit breaker damage current, or both.

13. The non-transitory, computer-readable medium of claim 9, wherein the instructions are configured to cause the processor to determine the health status based on detection of saturation.

14. The non-transitory, computer-readable medium of claim 9, wherein the instructions are configured to cause the processor to:

receive an input from a user indicating a setting of the circuit breaker; and adjust a setting in determining the health status based on the input from the user.

15. A method, comprising:

obtaining, via sensor circuitry of an intelligent electronic device (IED), an amount of current on at least one conductor of a power system that delivers electrical energy to a load;

obtaining a signal indicating tripping of a circuit breaker, wherein the circuit breaker is electrically connected to the electrical conductor to control current flow on the electrical conductor;

determining, via a processor operatively coupled to a memory of the IED, a health status indicating whether a mechanical arc extinguishing feature of the circuit breaker is damaged for subsequent operation based at least in part on the amount of current interrupted by the circuit breaker during tripping of the circuit breaker; and sending, via communication circuitry of the IED, a signal indicating the health status of the circuit breaker.

16. The method of claim 15, comprising sending the signal indicating the health status to an indicator based on the health status.

17. The method of claim 16, wherein the indicator comprises a display, a light emitting diode (LED) indicator, a human-to-machine (HMI) interface, a mechanical indicator, or any combination thereof, to indicate the health status to an operator.

18. The method of claim 15, comprising sending, via the communication circuitry, the signal indicating the health status to another electronic device.

19. The method of claim 18, comprising sending the signal via a serial communication channel, an ethernet communication channel, a wireless communication channel, or any combination thereof.

20. The method of claim 15, comprising preventing a contactor from closing until the circuit breaker is replaced.

* * * * *